(12) United States Patent
Chung et al.

(10) Patent No.: US 10,887,997 B2
(45) Date of Patent: Jan. 5, 2021

(54) METHOD FOR MANUFACTURING FLEXIBLE PRINTED CIRCUIT BOARD (FPCB) AND APPARATUS FOR MANUFACTURING FPCB

(71) Applicant: INKTEC CO., LTD., Gyeonggi-do (KR)

(72) Inventors: Kwang-Choon Chung, Gyeonggi-do (KR); Byung Woong Moon, Gyeonggi-do (KR)

(73) Assignee: INKTEC CO., LTD., Ansan-si (KR)

(*) Notice: Subject to any disclaimer, the term of this patent is extended or adjusted under 35 U.S.C. 154(b) by 0 days.

(21) Appl. No.: 15/336,221

(22) Filed: Oct. 27, 2016

(65) Prior Publication Data

US 2017/0127528 A1    May 4, 2017

(30) Foreign Application Priority Data

Oct. 30, 2015    (KR) .................. 10-2015-0152033

(51) Int. Cl.
| | |
|---|---|
| *H05K 3/10* | (2006.01) |
| *H05K 3/12* | (2006.01) |
| *H05K 3/06* | (2006.01) |
| *H05K 3/00* | (2006.01) |
| *B41F 11/00* | (2006.01) |

(52) U.S. Cl.
CPC .............. *H05K 3/106* (2013.01); *B41F 11/00* (2013.01); *H05K 3/061* (2013.01); *H05K 3/064* (2013.01); *H05K 3/1275* (2013.01); *H05K 3/0082* (2013.01); *H05K 2203/0143* (2013.01); *H05K 2203/0369* (2013.01); *H05K 2203/056* (2013.01); *H05K 2203/0557* (2013.01); *H05K 2203/107* (2013.01); *H05K 2203/1545* (2013.01)

(58) Field of Classification Search
CPC ...... H05K 3/0082; H05K 3/061; H05K 3/064; H05K 3/106; H05K 3/1275; H05K 1/028; H05K 2203/0143; H05K 2203/0369; H05K 2203/056; H05K 2203/0557; H05K 2203/107; H05K 2203/1545; B41F 11/00
See application file for complete search history.

(56) References Cited

U.S. PATENT DOCUMENTS

| | | | |
|---|---|---|---|
| 2008/0032209 A1* | 2/2008 | Imken ................. | H05K 3/0082 430/5 |
| 2013/0316152 A1* | 11/2013 | Kennett ............... | G03F 7/2035 428/195.1 |
| 2014/0199473 A1* | 7/2014 | Van Lammeren ........................ | H01L 51/0022 427/98.4 |

FOREIGN PATENT DOCUMENTS

| | | |
|---|---|---|
| CN | 103582568 A | 2/2014 |
| JP | 60-019037 U | 2/1985 |
| JP | 60019037 U * | 2/1985 |

(Continued)

OTHER PUBLICATIONS

Office Action dated Sep. 19, 2017 in Japanese Application No. 2016-212136.

(Continued)

*Primary Examiner* — Jose I Hernandez-Kenney
(74) *Attorney, Agent, or Firm* — Saliwanchik, Lloyd & Eisenschenk (57) ABSTRACT

The present disclosure relates to an apparatus for manufacturing flexible printed circuit board (FPCB) and method for manufacturing the FPCB, having no limitations of length of a circuit pattern being formed on a base film.

7 Claims, 9 Drawing Sheets

(56) References Cited

FOREIGN PATENT DOCUMENTS

| | | |
|---|---|---|
| JP | 2000-035677 A | 2/2000 |
| JP | 2000-232262 A | 8/2000 |
| JP | 2000-275865 A | 10/2000 |
| JP | 2005-217323 A | 8/2005 |
| JP | 2009-143090 A | 7/2009 |
| JP | 2009-545774 A | 12/2009 |
| JP | 2011-093124 A | 5/2011 |
| JP | 2012-183793 A | 9/2012 |
| KR | 10-2006-0070574 A | 7/2006 |
| KR | 10-2011-0080578 A | 7/2011 |
| KR | 101050876 B1 | 7/2011 |
| KR | 10-2014-0100628 A | 8/2014 |
| WO | WO-2012/069807 A2 | 5/2012 |
| WO | WO-2012/124950 A2 | 9/2012 |

OTHER PUBLICATIONS

Office Action dated Sep. 24, 2019 in Japanese Application No. 2016-212136.

* cited by examiner

METHOD FOR MANUFACTURING FLEXIBLE PRINTED CIRCUIT BOARD (FPCB) AND APPARATUS FOR MANUFACTURING FPCB

CROSS-REFERENCE TO RELATED APPLICATIONS

This application claims priority from Korean Patent Application No. 10-2015-0152033, filed on Oct. 30, 2015, in the Korean Intellectual Property Office, the disclosure of which is incorporated herein by reference in its entirety.

BACKGROUND

Field

The present disclosure relates to a method for manufacturing flexible printed circuit board (FPCB) and apparatus for manufacturing FPCB, and more particularly, to a method for manufacturing FPCB and apparatus for manufacturing FPCB, capable of manufacturing an FPCB having no limitations to a printable length.

Description of Related Art

In automobile electric cables, LED lighting devices, medical measurement facilities and various industrial fields, wire cables having the form of copper wires are generally used to supply power or transmit signals. However, such a copper form wire cable is thick and bulky, and thus there is a disadvantage that it is difficult to make a copper form wire cable of a three-dimensional circuit and the design itself slimmer. That is, in the automobile field, there have been recent attempts to change electric cables having the copper form to other forms in order to reduce the weight of vehicles, and it is not easy to apply copper form wire cables that are bulky and that require fastidious conditions for wiring even to lighting devices having lengthy forms such as LED lighting devices. Further, in the case of medical measurement equipment, there have been limitations to using cables of the copper wire form in photographing dangerous or narrow places that cannot be seen directly by humans.

Therefore, recently, in response to such technological demand, flexible flat cable (FFC) is emerging as an alternative. In this regard, methods for manufacturing FPCB using flexible copper clad laminate (FCCL) are being developed. That is, cables in the copper form are being replaced by FPCBs where printed lines have been extended in a major axis direction to electrically connect distant places.

Lithography methods are generally used to manufacture FPCBs to substitute for such FFCs. In order to manufacture a very long FPCB in the lithography method, a mask and a light exposing device corresponding to the length of the FPCB are required.

However, since the manufacturing cost for such a light exposing device and a mask is very high, there has been a problem of increase in the manufacturing cost of the FPCB manufactured accordingly in order to substitute for an FFC.

Further, since the mask or the light exposing device cannot be provided in an indefinite length, the length of the FPCB is limited as well, which is a problem.

Meanwhile, regarding the technology of manufacturing a printed circuit board that could substitute for a flexible flat cable (FFC), Korean Laid-open Patent Publication No. 10-2011-0080578 (Jul. 13, 2011) disclosed a method for manufacturing a cable for signal transmission by stacking a general single surface substrate and a two-surface substrate.

However, there is a disadvantage that in order to manufacture a flexible printed circuit board (FPCB) using a general single surface substrate and a two-surface substrate, it is difficult to manufacture a long cable due to characteristics of manufacturing the flexible printed circuit board (FPCB) and limitations of equipment, and because the manufacturing process is complicated.

PRIOR ART DOCUMENT

Patent (Patent 1) Korean Laid-open Patent Publication No. 10-2011-0080578

SUMMARY

Therefore, a purpose of the present disclosure is to solve the aforementioned problems of prior art, that is, to provide an apparatus for manufacturing FPCB and method for manufacturing FPCB, capable of manufacturing an FPCB having no limitations of length, easily and at low cost.

Another purpose of the present disclosure is to provide an apparatus for manufacturing FPCB and method for manufacturing FPCB, capable of forming printed lines of various shapes.

Ultimately, the purpose of the present disclosure is to provide an FPCB for flexible flat cable (FFC) substitution, that has no limitations of length, and that is capable of three-dimensional wiring and may be made slimmer.

The aforementioned purposes are achieved, according to the present disclosure, by a method for manufacturing FPCB, for forming a pattern on a base film in a roll-to-roll method, the method may comprise: a step of preparing a base film; a step of preparing a printing roll a surface of which is provided with a printing roll pattern in a direction inclined with respect to a moving direction of the base film; and a step of forming a pattern that is inclined with respect to the moving direction of the base film by the printing roll pattern as the base film passes the printing roll.

Here, at the step of preparing a base film, the base film on which a conductive material is applied may be prepared, and the step of forming a pattern may comprise a step of forming a photosensitive pattern on the base film by the printing roll, and a step of irradiating light to the base film on which the photosensitive pattern is formed, thereby the inclined pattern being formed on the base film.

Further, at the step of preparing a base film, the base film on which a conductive material and a photosensitive material are applied on may be prepared, and at the step of preparing a printing roll, the printing roll which has a hollow unit provided with a light source is formed inside the printing roll and which has a shielding pattern that selectively shields light emitted from the light source may be prepared, and a jig for light transmission divided into a transmission area that transmits light and a shielding area that shields light may be prepared between the printing roll and the base film.

Here, the printing roll may include a main body of a light-transmitting material, and it is preferable that the shielding pattern is formed on a surface of the main body to selectively transmit light, thereby efficiently hardening the photosensitive pattern.

Further, at the step of preparing a printing roll, it is preferable that the printing roll is provided in a pair such that at the step of forming a pattern, the pattern is formed on both surfaces of the base film.

Meanwhile, at the step of preparing a printing roll, gaps between the printing roll patterns at a same phase of the printing roll may be prepared to be different from one another and the printing roll pattern may be prepared in a plurality of printing roll patterns.

Further, the plurality of printing roll patterns may be prepared such that gaps between neighboring printing roll patterns are different from one another. At the step of preparing a printing roll, the printing roll pattern may be prepared to be bent or disconnected at a predetermined area.

The aforementioned purposes are achieved by an apparatus of manufacturing FPCB comprising a printing roll configured to form a pattern on a base film to form the pattern in a roll-to-roll method, that is another characteristic of the present disclosure, wherein the printing roll comprises a printing roll pattern provided in a direction inclined with respect to a moving direction of the base film to form the pattern.

Here, a conductive material may be applied on the base film, and the printing roll may be configured to apply a photosensitive material on the base film, and a conductive material and a photosensitive material may be applied on the base film, and the printing roll may include therein a hollow unit where a light source is provided, and include a shielding pattern that may selectively shield light being emitted from the light source, and include a jig for light transmission divided into a transmission area that may transmit light and a shielding area that shields light, between the printing roll and the base film, thereby the pattern being formed on the base film. Here, the printing roll may include a main body of a light transmitting material, and the shielding pattern may be formed on a surface of the main body to selectively transmit light.

The printing roll pattern may be provided in the form of coil from one end to the other end of both ends of the printing roll, gaps between the printing roll patterns at a same status of the printing roll may be different from one another, and the printing roll pattern may be provided in a plurality of printing roll patterns. Further, the plurality of printing roll patterns may be prepared such that gaps between neighboring printing roll patterns are different from one another. Meanwhile, the printing roll pattern may be prepared to be bent or disconnected in a predetermined area. Further, printing roll may be provided in one pair, so that the pattern is formed on both surfaces of the base film at the same time.

According to the present disclosure, there is provided an apparatus for manufacturing FPCB, capable of manufacturing an FPCB having no limitations of length, easily at low cost.

Further, there is provided an apparatus for manufacturing FPCB, capable of forming printed lines of various shapes.

Further, there is provided an FPCB for flexible flat cable (FFC) substitution, printed by the aforementioned method for manufacturing FPCB, and is thus capable of three-dimensional wiring and being made slimmer.

DETAILED DESCRIPTION

Hereinafter, a method for manufacturing FPCB according to a first embodiment of the present disclosure will be explained in detail with reference to the drawings attached.

Figure 1:
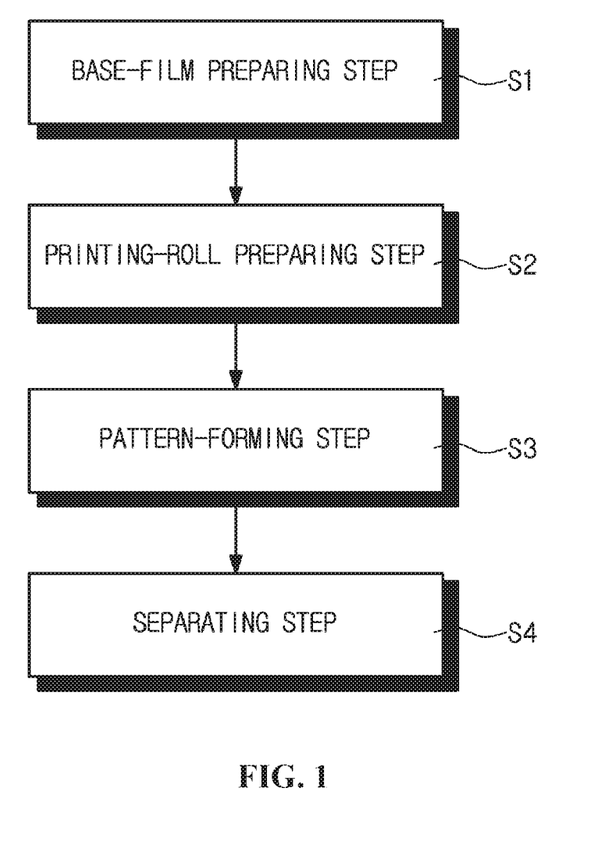
FIG. 1 is a flowchart illustrating a method for manufacturing FPCB according to a first embodiment of the present disclosure.
Figure 2:
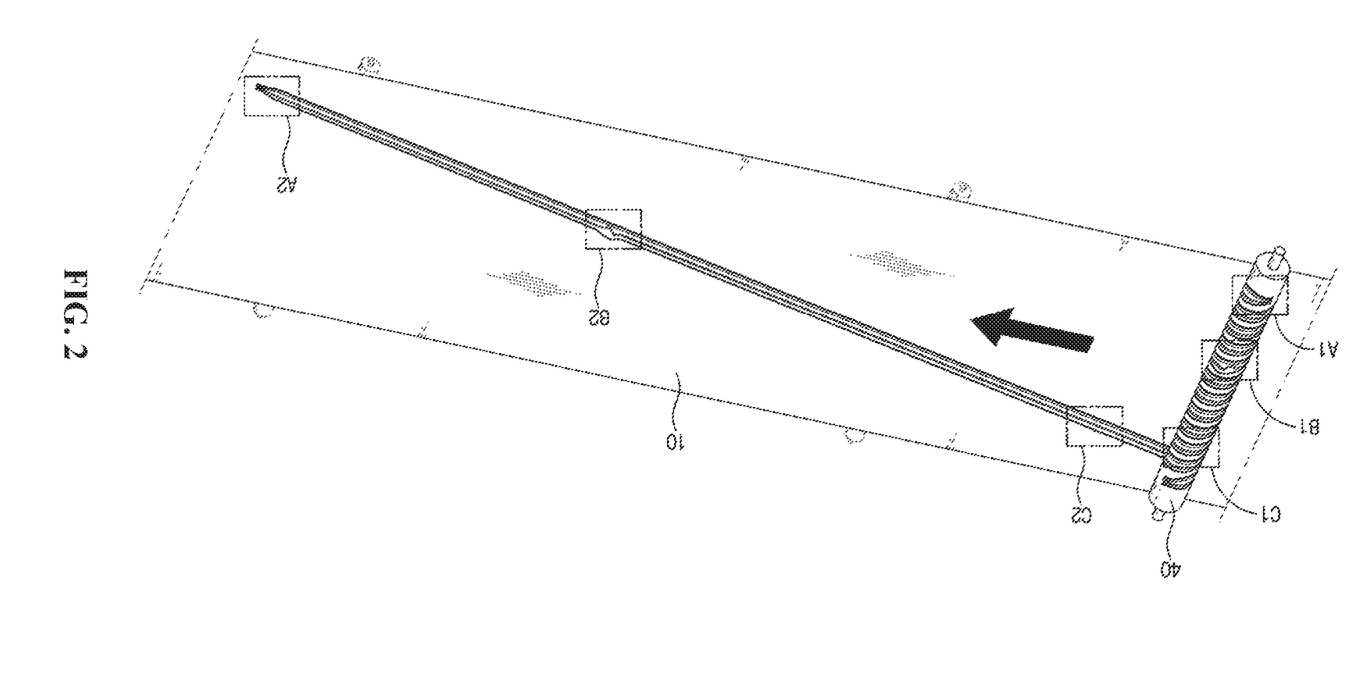
FIG. 2 is a schematic view illustrating a pattern forming step where a pattern is formed by a printing roll.

FIG. 1 is a flowchart illustrating a method for manufacturing FPCB according to a first embodiment of the present disclosure, and FIG. 2 is a schematic view illustrating a pattern forming step where a pattern is formed by a printing roll.

As illustrated in the drawings, the method for manufacturing FPCB according to the present disclosure includes a base-film preparing step (S1), that is a step of preparing a base film, a printing-roll preparing step (S2), that is a step of preparing a printing roll which has a printing roll pattern formed in an inclined direction, a pattern forming step (S3), that is a step of forming a pattern in a direction inclined with respect to a moving direction of the base film, and a separating step (S4), that is a step of separating an area where a circuit pattern has been formed from the base film.

First, at the base-film preparing step (S1), a base film 10 is arranged. In the first embodiment of the present disclosure, a pattern is to be printed directly on the base film 10, and thus at the base-film preparing step (S1), no further treatment is made on the base film 10. In the first embodiment of the present disclosure, the pattern to be printed on the base film 10 is a conductive pattern, but there is no limitation thereto.

At the printing-roll preparing step (S2), a printing roll 40 is mounted onto the device to prepare for printing. As illustrated in FIG. 2, in order to form patterns 11, A2, B2, and C2 on the base film 10, printing roll pattern patterns 41, A1, B1, and C1 are respectively formed in a direction inclined with respect to a moving direction of the base film 10. The printing roll pattern 41 having a shape identical to the pattern to be printed is provided in the form of being wound up around the printing roll 40 in an inclined direction. That is, the printing roll pattern 41 is formed on a surface of the printing roll 40 in the form of coil starting from one end of the printing roll 40 towards the other end of the printing roll 40. Therefore, as the printing roll 40 rotates, the pattern 11 is formed on the base film 10 such that it extends in a direction inclined with respect to a longitudinal direction of the base film 10. Due to such a characteristic of the printing roll 40, a very long pattern may be formed efficiently.

Figure 3:
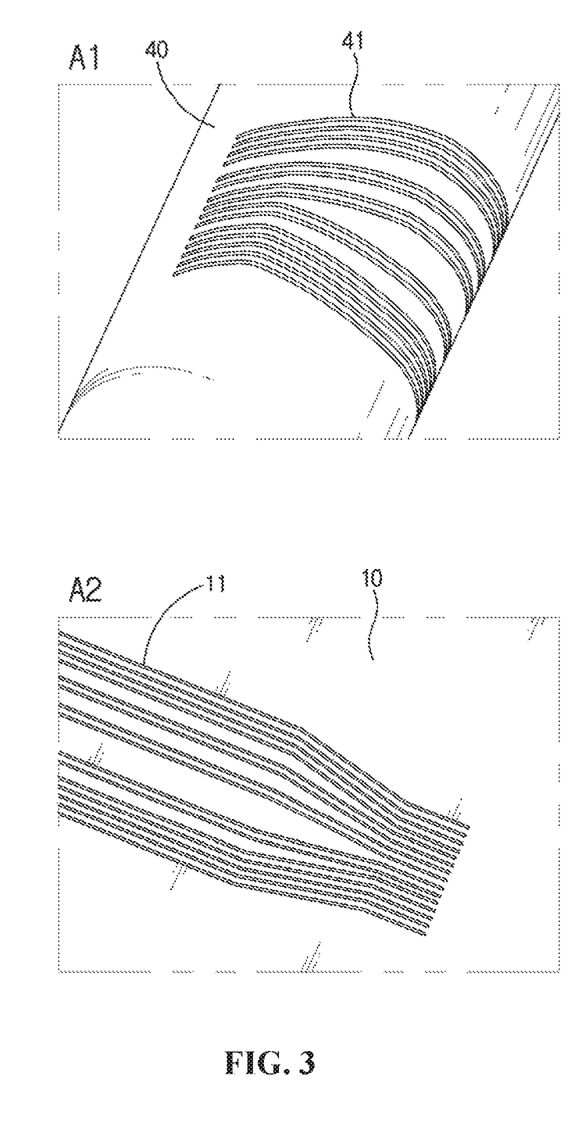
FIGS. 3 to 5 are schematic views illustrating patterns formed on base films according to various printing roll patterns formed on a printing roll.
Figure 4:
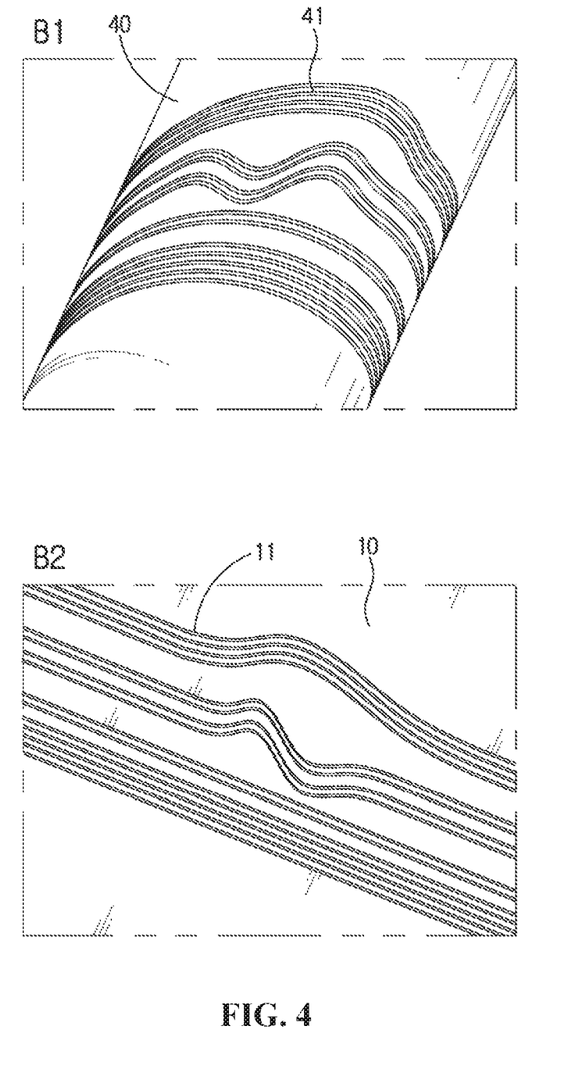
Figure 5:
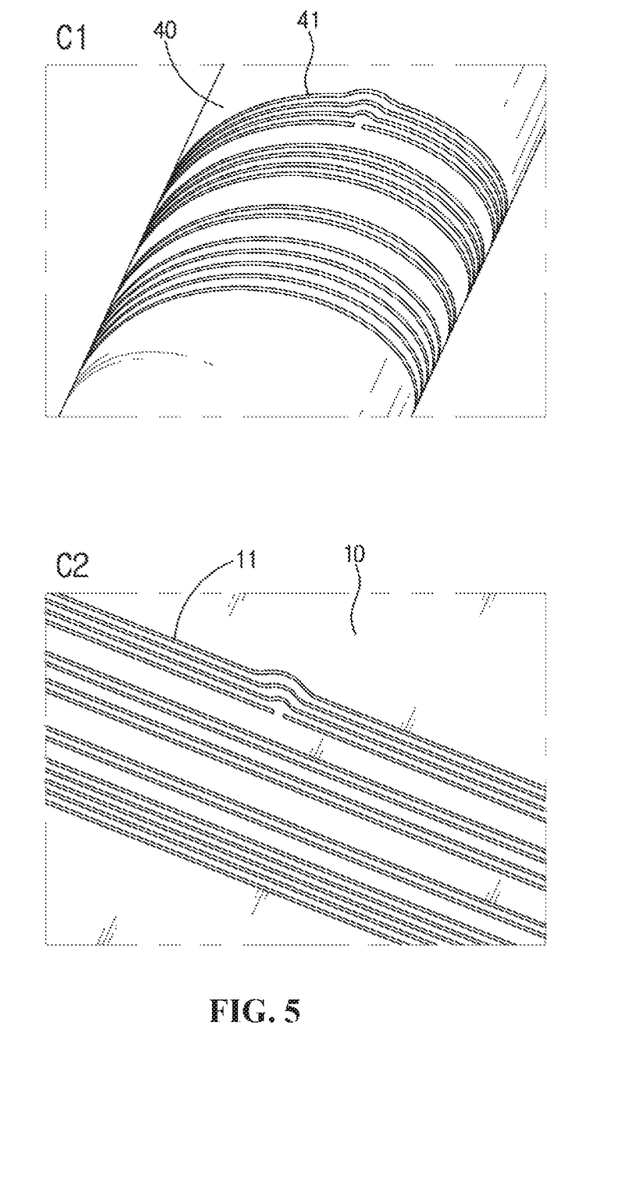

FIGS. 3 to 5 are perspective views illustrating patterns formed on base films according to various printing roll patterns provided on a printing roll. Bend portions at the end of the pattern printed as in FIG. 3 may also be printed smoothly, and a pattern having curved shapes as in FIG. 4 may also be printed by providing the printing roll 40 with a printing roll pattern 41 of an identical shape, and a pattern may also be printed as being disconnected in the middle as in FIG. 5.

Meanwhile, by adjusting the thickness of the printing roll 40 or by adjusting the gap between the printing roll patterns 41 at the same phase, the length of the pattern 11 being formed on the base film 10 may be adjusted. That is, when the thickness of the printing roll 40 is adjusted to be thick or the gap between the printing roll patterns 41 is adjusted to be narrow, the pattern 11 being printed on the base film 10 may be lengthened, and when the thickness of the printing roll 40 is adjusted to be thin or the gap between the printing roll patterns 41 is adjusted to be broad, the pattern 11 being printed on the base film 10 may be relatively shortened.

Therefore, even a pattern having a very complicated shape can be printed on the base film 10 very efficiently by winding a printing roll pattern 41 having a shape identical to that of the said pattern around the printing roll 40.

At the pattern forming step (S3), as the base film 10 wound up around a winding roll 30 (see FIG. 9) is unwounded, the base film 10 is introduced into the printing roll 40. The input base film 10 passes the printing roll 40, and a pattern 11 is printed on the base film 10. Here, since the printing roll pattern 41 of the printing roll 40 is formed in an inclined direction, the pattern 11 being printed on the base film 10 is formed in a direction inclined with respect to a longitudinal direction of the base film 10.

Here, the starting point of the pattern 11 being printed corresponds to the starting point of the printing roll pattern 41 of the printing roll 40, and as the printing roll 40 rotates, the pattern 11 is printed on the base film 10.

Meanwhile, in the first embodiment of the present disclosure, printing may be performed in a method of direct printing on the base film, for example, gravure method, flexography method, or rotary screen method.

First of all, when applying the gravure printing method, the printing roll 40 may be made of a metal material, the printing roll pattern 41 may be formed on the printing roll 40 by chemical etching, and the printing roll pattern 41 may be formed by laser processing.

Next, when applying the flexography method, the printing roll 40 may be made of a plastic polymer material, and the printing roll pattern 41 may be formed by laser etching.

Further, when applying the rotary screen method, the printing roll pattern 41 is formed in a lithography method on a roll screen made of a photosensitive material, and then the roll screen is mounted onto the printing roll 40. Thereafter, an ink supply unit (not illustrated) for supplying conductive ink is provided inside the printing roll 40 so that a circuit pattern may be formed.

At the separating step (S4), when the printing roll 40 rotates and the printing is completed, a portion excluding the pattern 11 of the inclined direction 11 may be removed from the base film 10, thereby acquiring the base film 10 where the circuit pattern 11 is formed.

Thereafter, an FPCB is prepared through subsequent processes etc.

Meanwhile, by preparing the aforementioned printing roll 40 in one pair and arranging them to correspond to both surfaces of the base film 10, it is possible to print patterns on both surfaces of the base film 10 at the same time. Here, it is obviously possible to form a separate via hole (not illustrated) to connect front and rear patterns to each other.

Figure 6:
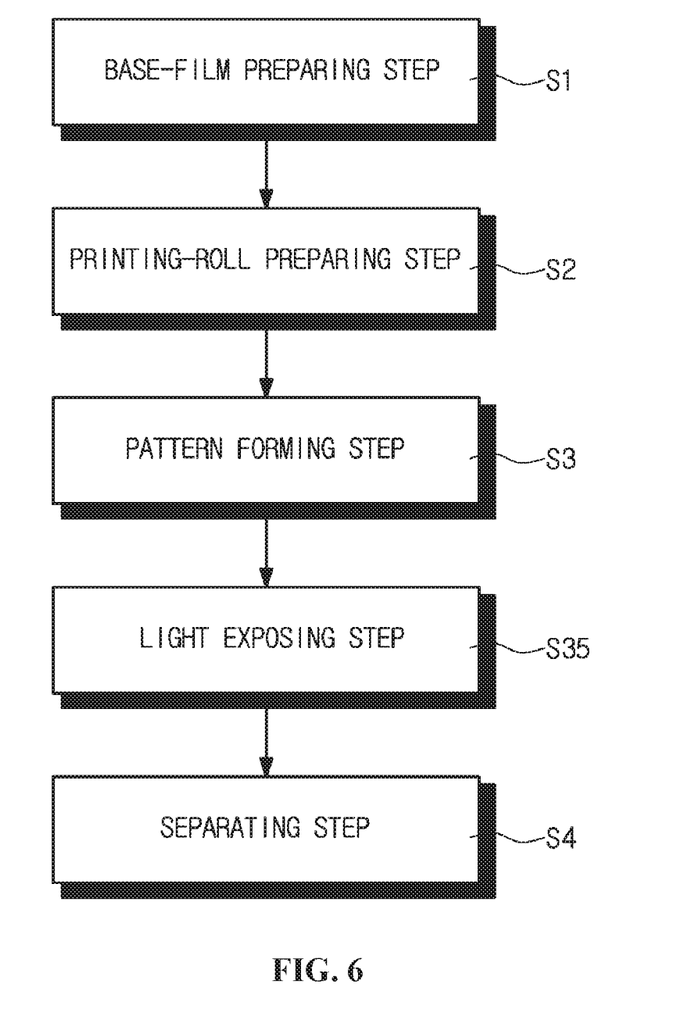
FIG. 6 is a flowchart of a method for manufacturing FPCB according to a second embodiment of the present disclosure.

Next, a method for manufacturing FPCB according to a second embodiment of the present disclosure will be explained in detail. FIG. 6 is a flowchart illustrating the method for manufacturing FPCB according to the second embodiment of the present disclosure.

As illustrated in the drawings, the method for manufacturing FPCB according to the second embodiment of the present disclosure includes a base-film preparing step (S1), that is, a step of preparing by applying a conductive material 15 on a base film 10, a printing-roll preparing step (S2) of preparing a printing roll 40 on which a printing roll pattern 41 is formed, a pattern forming step (S3), that is a step of forming a photosensitive pattern 16 in a direction inclined with respect to a moving direction of the base film 10 (S3), a light exposing step (S35), that is a step of exposing the base film 10 having the photosensitive pattern 16 to light, and a separating step (S4).

In the second embodiment of the present disclosure, unlike in the first embodiment where the conductive pattern 11 is directly printed on the base film 10, the conductive material 15 is applied on the base film 10 in advance and then the photosensitive pattern 16 is formed on the base film 10 using the printing roll 40. That is, at the base-film preparing step (S1), the conductive material 15 is applied on the base film 10 in advance, to prepare the base film 10. Next, at the printing-roll preparing step (S2), the printing roll 40 having the printing roll pattern 41 for forming the photosensitive pattern 16 is prepared. The printing roll pattern 41 is provided such that it is wound up around the printing roll 40 in the shape of coil, just as in the first embodiment.

Therefore, just as in the first embodiment, various forms of photosensitive patterns 16 may be formed without any limitations of length.

Then, at the pattern forming step (S3), on the base film 10 where the conductive material 15 is applied, the photosensitive pattern 16 is formed by the printing roll 40, and at the light exposing step (S35), the photosensitive pattern 16 formed on the base film 10 is hardened. Thereafter, through subsequent processes such as an additional etching and the like, a pattern is formed on the base film 10.

Here, the order of the light exposing step (S35) and the separating step (S4) may be exchanged depending on circumstances of the process.

Figure 7:
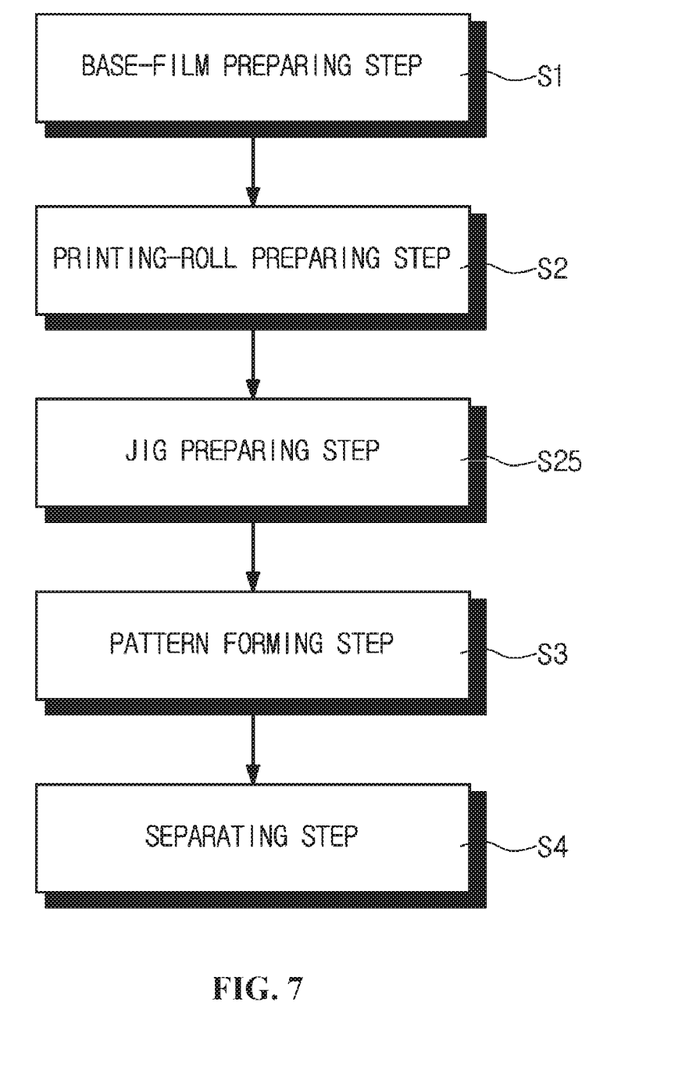
FIG. 7 is a flowchart of a method for manufacturing FPCB according to a third embodiment of the present disclosure.
Figure 8:
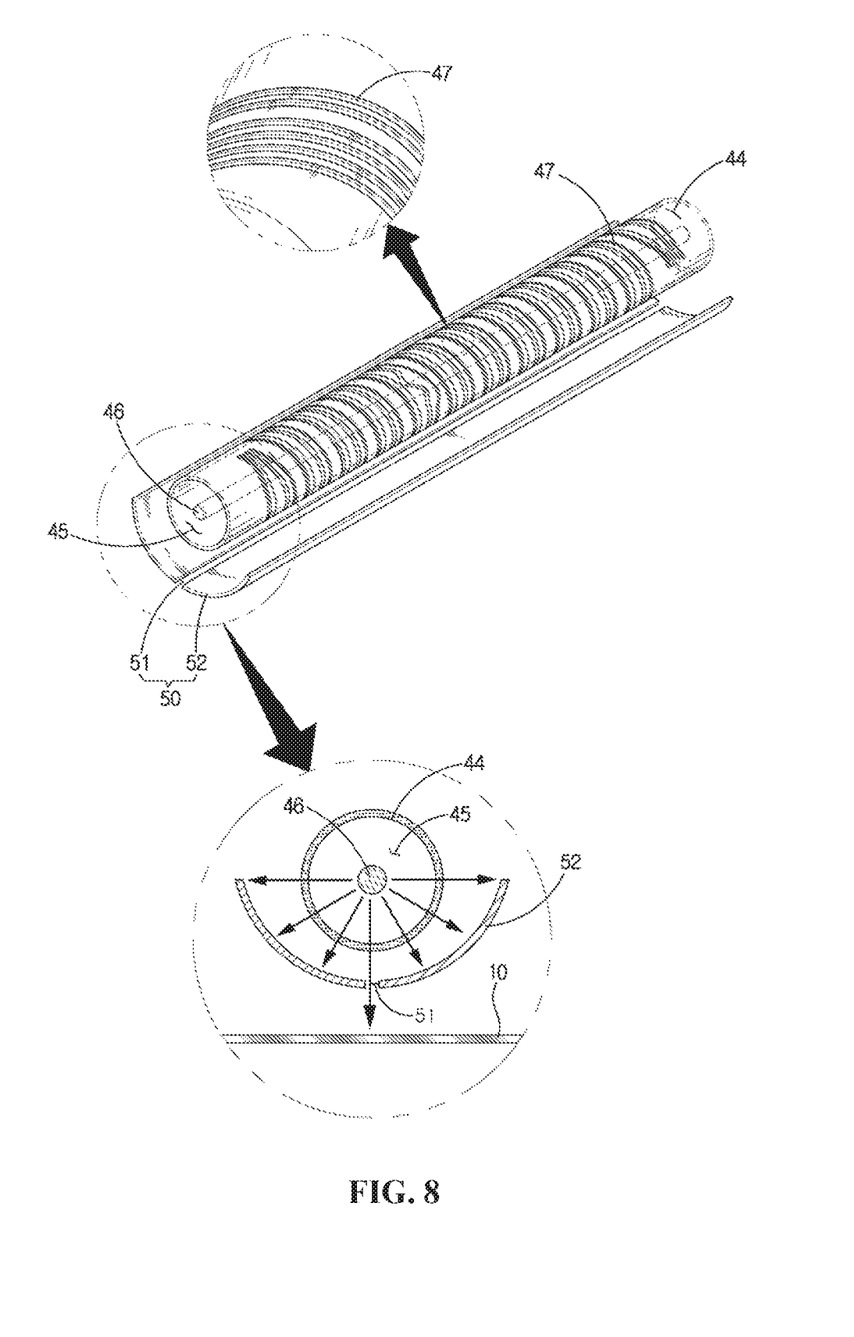
FIG. 8 is a perspective view illustrating printing roll and a portion of a jig for light transmission.

Next, a method for manufacturing FPCB according to a third embodiment of the present disclosure will be explained. FIG. 7 is a flowchart illustrating the method for manufacturing FPCB according to the third embodiment of the present disclosure, and FIG. 8 is a perspective view illustrating a printing roll and a portion of a jig for light transmission according to the third embodiment of the present disclosure.

As illustrated in the drawings, the method for manufacturing FPCB according to the third embodiment of the present disclosure is characterized in applying a photosensitive material 17 on the base film 10 in advance, and then selectively exposing the photosensitive material 17 to light using the printing roll 40 in accordance with the pattern to be formed.

First of all, at the base-film preparing step (S1), a conductive material 15 and a photosensitive material 17 are applied on the base film sequentially.

Then, at the printing-roll preparing step (S2), a main body 44 having a hollow unit 45 inside thereof and capable of transmitting light is formed, and a light source 46 capable of emitting light is provided in the hollow unit 45.

Here, the main body 44 is made of a light-transmitting material such as quartz, and UV or laser light may be used as the light source 46, but there is no limitation thereto. That is, any light source capable of hardening the photosensitive material may be used.

Meanwhile, on a surface of the main body 44, a shielding pattern 47 capable of selectively shielding light may be formed. The shielding pattern 47 selectively shields the light being emitted from the light source 46 inside the main body 44 in accordance with the shape of the shielding pattern 47, so that the light being emitted from the light source 46 may be selectively transmitted to the outside of the printing roll 40. By doing this, the photosensitive material 17 of the base film 10 is hardened to correspond to the shape of the pattern to be formed.

At the jig preparing step (S25), between the printing roll 41 and the base film 10, a jig for light transmission 50 is prepared, that is divided into a light transmission area 51 where light may be transmitted and a shielding area 52 that shields light. On the jig for light transmission 50, the transmission area 51 is formed in a direction which transverses the moving direction of the base film 10, and on the remaining portion, the shielding area 52 that shields light is provided.

When light is being emitted from the light source 46 inside the printing roll 50 to outside of the printing roll 41, light is emitted in a radial form, and that is why the jig for light transmission 50 is provided, so that light may arrive at only the selected portion of the base film 10.

Then, at the pattern forming step (S3), by the printing roll 40 and the jig for light transmission 50, the light being radially emitted from the printing roll 40 by the shielding pattern 47 may be emitted to only a certain desired area in the longitudinal direction of the base film 10. Here, since the printing roll 40 and the base film 10 do not directly contact each other, the rotation speed of the printing roll 40 and the moving speed of the base film 10 may be synchronized to each other.

Then, a desired pattern is formed on the base film 10 through subsequent processes such as etching and the separating step (S4).

Meanwhile, although it was explained hereinabove with reference to the third embodiment that the main body 44 is made of a light-transmitting material and the shielding pattern 47 that selectively shields light is formed on the surface of the main body 44, the main body 44 may be made of a material that cannot transmit light, and a penetrating pattern (not illustrated) may be formed so that light may penetrate.

Next, the apparatus for manufacturing FPCB that is another characteristic of the present disclosure will be explained with reference to the drawings attached.

Figure 9:
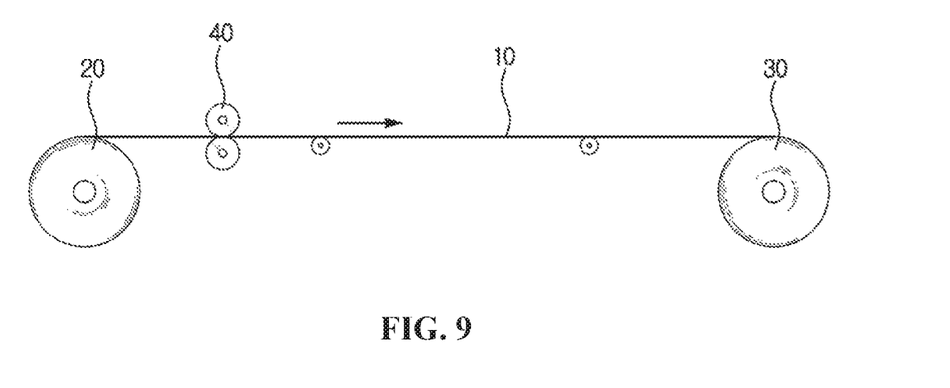
FIG. 9 is a schematic view schematically illustrating an apparatus for manufacturing FPCB, that is another characteristic of the present disclosure.

FIG. 9 is a schematic view illustrating the apparatus for manufacturing FPCB according to a first embodiment of the present disclosure. As illustrated in the drawing, the apparatus for manufacturing FPCB according to the first embodiment of the present disclosure forms a circuit pattern directly on the base film 10 in a roll-to-roll method.

That is, when a printing roll 40 is arranged between winding rolls 20, 30 provided at both sides, and as the base film 10 is unwound from the winding roll 20 at one side and moves to the winding roll 30 at the other side, a circuit pattern is printed on the base film 10 by the printing roll 40.

The printing roll 40 includes, on a surface thereof, a printing roll pattern 41 formed in a direction inclined with respect to the moving direction of the base film 10, in order to form a pattern on the base film 10. The printing roll pattern 41 is formed on the printing roll 40 in the form of coil starting from one end of the printing roll 40 towards the other end of the printing roll 40.

Therefore, as the printing roll 40 rotates, a pattern 11 is formed on the base film 10 at length in a direction inclined with respect to a longitudinal direction of the base film 10. Here, the printing roll and the direct printing method were already disclosed hereinabove in the explanation for the method for manufacturing FPCB, and thus detailed explanation will be omitted.

Next, an apparatus for manufacturing FPCB according to a second embodiment of the present disclosure will be explained.

The configuration of the apparatus for manufacturing FPCB according to the second embodiment of the present disclosure is identical to that of the first embodiment, except that a photosensitive pattern 16 is printed by the printing roll 40 on the base film 10 where a conductive material 15 has been applied.

That is, in the case of the first embodiment, a pattern 11 is directly printed on the base film 10 by the printing roll 40, but in the case of the second embodiment, the photosensitive pattern 16 is printed by the printing roll 40. Since the rest of the configuration is identical to that of the first embodiment, and was already explained in the second embodiment of the method for manufacturing FPCB earlier on, detailed explanation will be omitted.

Next, an apparatus for manufacturing FPCB according to a third embodiment of the present disclosure will be explained.

As illustrated in FIG. 8 explained earlier on, the printing roll of the apparatus for manufacturing FPCB according to the third embodiment includes a main body 44 having a hollow unit 45 inside thereof and made of a material capable of transmitting light, and a light source 46 capable of emitting light, provided in the hollow unit 45.

Further, on a surface of the main body 44, a shielding pattern 47 capable of selectively shielding light, is formed, Here, the shielding pattern 47 is formed in a direction inclined with respect to the printing direction just as in other embodiments.

Accordingly, the light being emitted from the light source 46 provided inside is emitted outside selectively by the shielding pattern 47. Further, between the printing roll 40 and the base film 10, a jig for light transmission 50 is formed, that is divided into a transmission area 51 that transmits light and a shielding area 52 that shields light.

The transmission area 51 of the jig for light transmission 50 is formed in a direction which transverses the moving direction of the base film 10, and the shielding area 52 plays a role of shielding the light being emitted from the printing roll 40 in a radial direction, and is provided in a semicircular form in the present embodiment, but there is no limitation thereto. For example, the shielding area 52 may be provided in a cylindrical form which surrounds the printing roll 40, and the transmission area 51 may be formed to extend in a longitudinal direction on a bottom part.

Therefore, the light being emitted from the printing roll 40 radially by the shielding pattern 47 may be emitted to only a certain area of the base film 10. By doing this, when light is emitted selectively by the shielding pattern 47 and the jig for light transmission 50 formed on the printing roll 40, on the base film 10 where the conductive material 15 and the photosensitive material 17 have been applied sequentially, the photosensitive material 17 of the base film 10 is selectively hardened, and a pattern may be formed on the base film 10 through subsequent processes such as etching etc.

The right of the scope of the present disclosure is not limited to the aforementioned embodiments but may be realized in various types of embodiments within the claims attached hereto. It will be apparent to one of ordinary skill in the art that various changes in form and details may be made in these examples without departing from the spirit and scope of the claims and their equivalents.

REFERENCE NUMERALS

10: BASE FILM 11: PATTERN
15: CONDUCTIVE MATERIAL
16: PHOTOSENSITIVE PATTERN
17: PHOTOSENSITIVE MATERIAL
20, 30: WINDING ROLL
40: PRINTING ROLL
41: PRINTING ROLL PATTERN
44: MAIN BODY
45: HOLLOW UNIT
46: LIGHT SOURCE
47: SHIELDING PATTERN
50: JIG FOR LIGHT TRANSMISSION
51: TRANSMISSION AREA
52: SHIELDING AREA
S1: BASE-FILM PREPARING STEP
S2: PRINTING ROLL PREPARING STEP
S25: JIG PREPARING STEP
S3: PATTERN FORMING STEP
S35: LIGHT EXPOSING STEP
S4: SEPARATING STEP

What is claimed is:

1. A method of manufacturing a flexible printed circuit board (FPCB), for forming a pattern on a base film in a roll-to-roll method, the method comprising:
    a step of preparing a base film;
    a step of preparing a printing roll having a cylinder shape and a surface that has a printing roll pattern that is inclined at an angle with respect to a longitudinal direction of the printing roll; and
    a step of forming a pattern that is inclined with respect to a moving direction of the base film by the printing roll pattern as the base film passes the printing roll,
    wherein the printing roll pattern is configured to have a form of a coil continuously extending from one end of the printing roll to the other end of the printing roll,
    wherein the step of preparing a base film comprises a step of preparing the base film on which a conductive material and a photosensitive material are applied, the step of preparing a printing roll comprises a step of preparing the printing roll that has a hollow unit provided with a light source formed inside the printing roll and that has a shielding pattern that selectively shields light emitted from the light source, and a step of preparing a jig interposed between the printing roll and the base film for light transmission, the jig being divided into a light transmission area that transmits light and a shielding area that shields light between the printing roll and the base film, and
    wherein the jig has a cross section of a semi-circular shape, the light transmission area of the jig is formed at a center of the jig on the cross section of the jig in a moving direction of the base film, and the shielding area of the jig is provided at areas other than the light transmission area.

2. The method according to claim 1,
    wherein the step of forming a pattern comprises a step of forming a photosensitive pattern on the base film by the printing roll, and a step of irradiating light to the base film on which the photosensitive pattern is formed, thereby the inclined pattern being formed on the base film.

3. The method according to claim 1,
    wherein the printing roll comprises a main body of a light-transmitting material, and the main body has a surface on which the shielding pattern is formed to selectively transmit light.

4. The method according to claim 1,
    wherein the step of preparing a printing roll comprises a step of making gaps between neighboring points of the printing roll pattern at a same phase of the printing roll, the gaps being different from one another.

5. The method according to claim 1,
    wherein the step of preparing a printing roll comprises a step of bending the printing roll pattern at a predetermined area.

6. The method according to claim 1,
    wherein the printing roll pattern comprises a plurality of pattern lines.

7. The method according to claim 6,
    wherein the step of preparing a printing roll comprises a step of making gaps between neighboring pattern lines of the printing roll pattern, the gaps being different from one another.

* * * * *